United States Patent [19]
Tachigori

[11] Patent Number: 6,042,276
[45] Date of Patent: Mar. 28, 2000

[54] LIGHT RECEIVING MODULE

[75] Inventor: Masashi Tachigori, Tokyo, Japan

[73] Assignee: NEC Corporation, Tokyo, Japan

[21] Appl. No.: 09/108,823

[22] Filed: Jul. 1, 1998

[30] Foreign Application Priority Data

Jul. 2, 1997 [JP] Japan ..................................... 9-176256

[51] Int. Cl.[7] .................................................. G02B 6/36
[52] U.S. Cl. .............................................. 385/88; 385/88
[58] Field of Search ................................ 385/88–94, 14, 385/25

[56] References Cited

U.S. PATENT DOCUMENTS 5,909,523  6/1999  Sakaino et al. ...................... 385/88 X

FOREIGN PATENT DOCUMENTS 7-174944  7/1995  Japan .

Primary Examiner—Phan T. H. Palmer
Attorney, Agent, or Firm—Scully, Scott, Murphy and Presser

[57] ABSTRACT

A light receiving module of the present invention includes a semiconductor substrate formed with a guide groove and a mount groove for receiving an optical fiber and a light receiving device, respectively. The mount groove includes a mount surface to which the light receiving device is affixed. The mount surface is contiguous with the output end of the guide groove. The light receiving device is inserted into the accurately formed guide groove and then affixed to the mount surface of the groove. The fiber and light receiving device can therefore be accurately positioned relative to each other. This, coupled with the fact that the optical coupling length is reduced because of the close contact of the fiber and light receiving device, implements adjustment-free mounting and therefore high optical coupling.

8 Claims, 6 Drawing Sheets

SUBSTRATE SIDE    ELECTRODE SIDE

12 ALIGNMENT PATTERN (SUBSTRATE)
10
12
21 ALIGNMENT PATTERN (DEVICE)

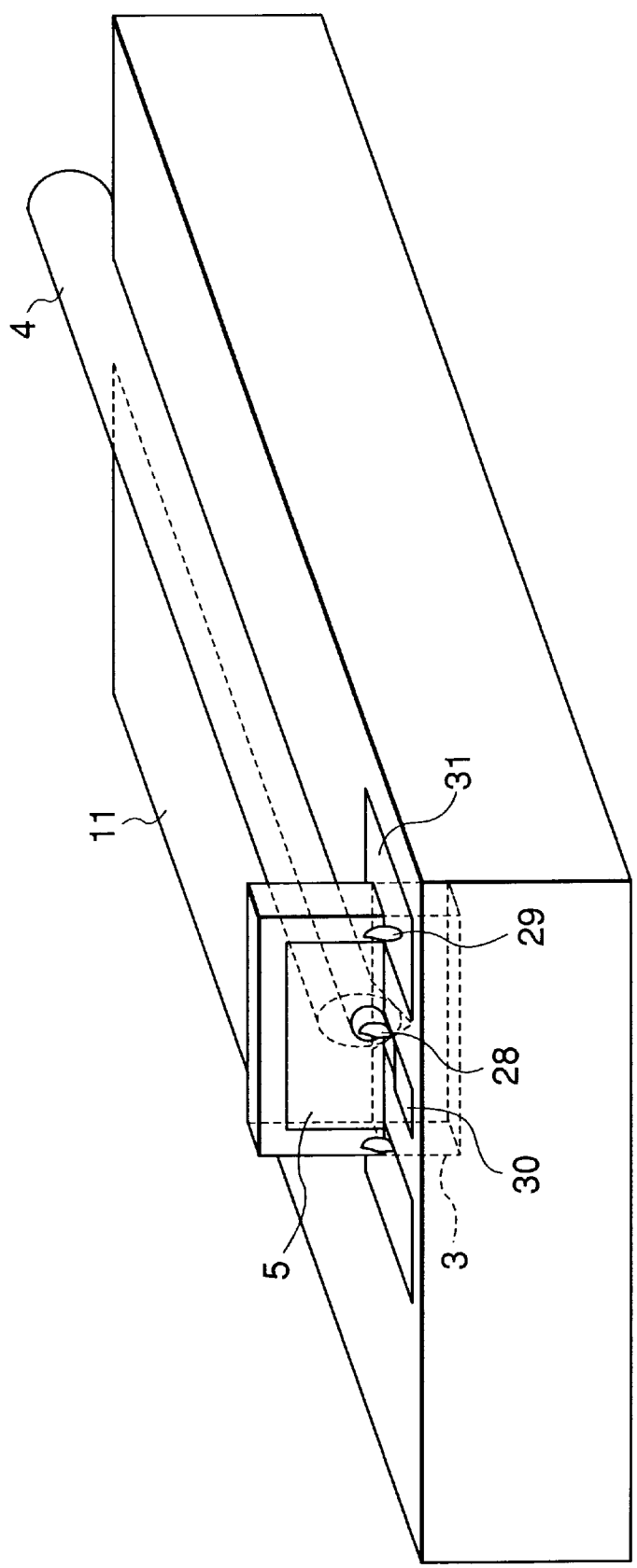

LIGHT RECEIVING MODULE

BACKGROUND OF THE INVENTION

The present invention relates to a light receiving module and, more particularly, to a light receiving module of the type having a light receiving device and an optical fiber affixed to a semiconductor substrate together.

A light receiving module of the type described is taught in, e.g., Japanese patent laid-open publication No. 7-174944. The module taught in this document includes a light receiving device portion accurately mounted to a submount substrate formed with an accurately etched V-shaped projection. An optical fiber portion is positioned on a silicon substrate having V-shaped grooves formed by anisotropic etching.

The above conventional light receiving module has some problems left unsolved, as follows. Because the light receiving device and optical fiber are mounted on different substrates, it is likely that they are positionally deviated from each other during assembly. Further, mounting the light receiving device to the subcarrier results in additional capacity. Because a preamplifier or similar high speed module is easily effected by an input portion, the extra capacity obstructs the application of the above structure to a high speed module.

SUMMARY OF THE INVENTION

It is therefore an object of the present invention to provide a light receiving module capable of solving the above problems and allowing a light receiving device and an optical fiber to be accurately coupled to each other without any positional deviation.

It is another object of the present invention to provide a light receiving module capable of reducing parasitic capacity and therefore operating at high speed.

A light receiving module of the present invention has a semiconductor substrate, and a light receiving device and an optical fiber affixed to the semiconductor device together. A guide groove is formed in the semiconductor substrate and fixedly receives the optical fiber. A mount groove is also formed in the semiconductor substrate contiguously with the output end of the guide groove and fixedly receives the light receiving device. A mount surface included in the mount groove and to which the light receiving device is mounted is contiguous with the output end of the guide groove.

BRIEF DESCRIPTION OF THE DRAWINGS

The above and other objects, features and advantages of the present invention will become apparent from the following detailed description when taken with the accompanying drawings in which:

FIG. 11 shows another alternative embodiment of the present invention.

Figure 1:
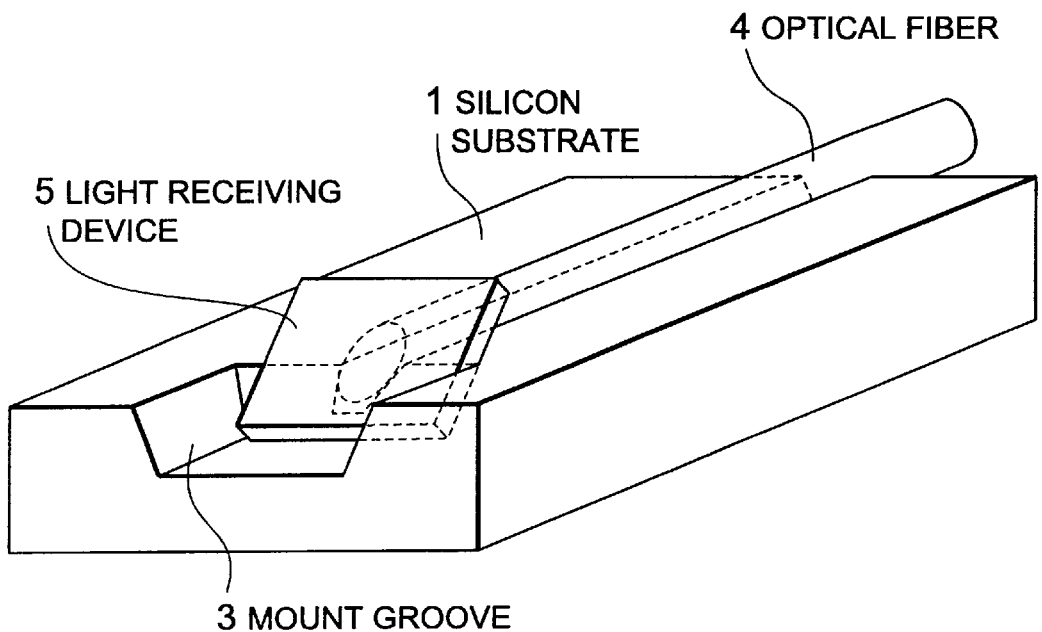
FIG. 1 is a perspective view showing a light receiving module embodying the present invention.

In the drawings, identical references denote identical structural elements.

DETAILED DESCRIPTION OF THE PREFERRED EMBODIMENTS

Figure 2:
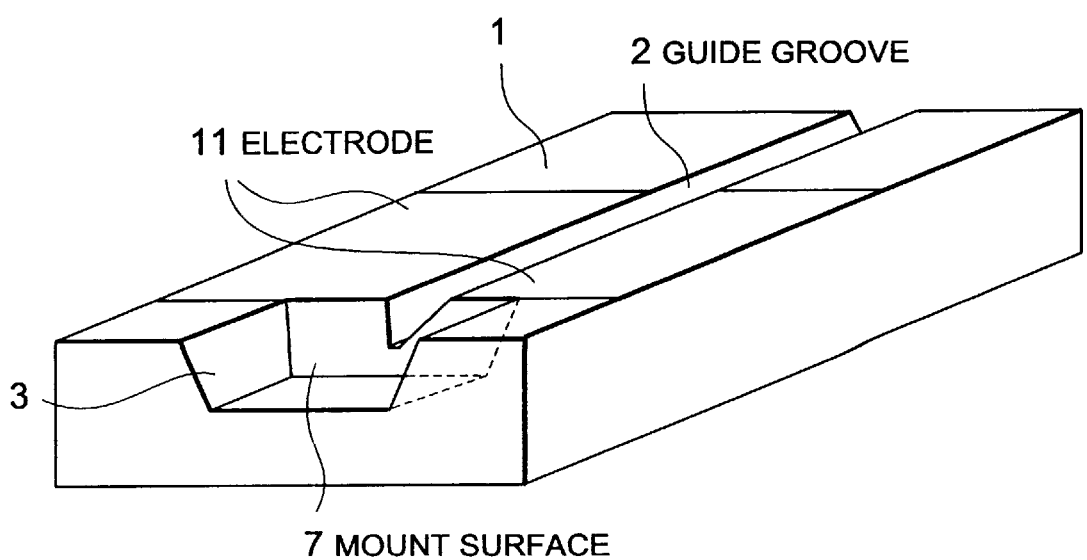
FIG. 2 is a perspective view of a silicon substrate included in the illustrative embodiment.
Figure 3:
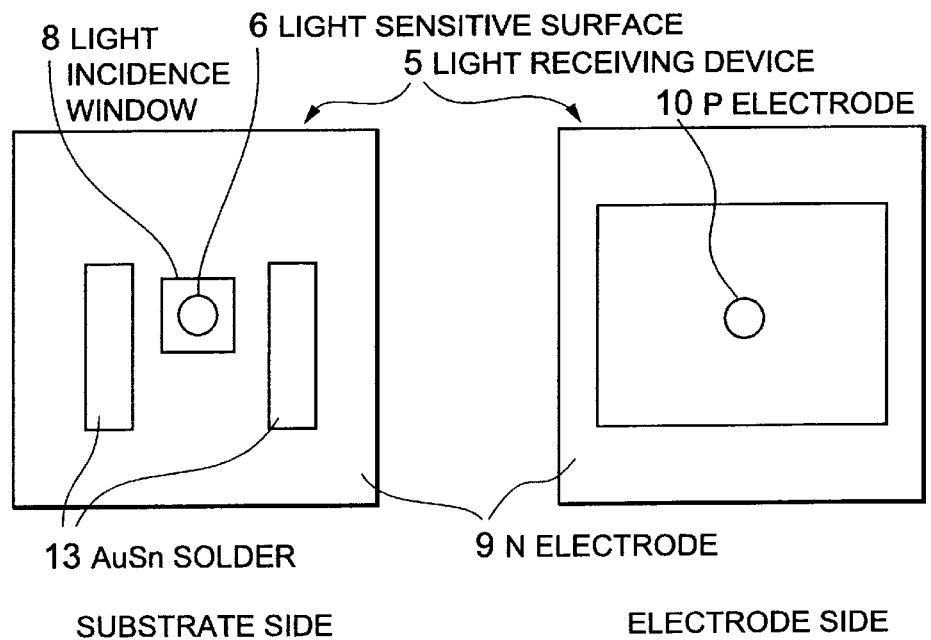
FIG. 3 shows opposite sides of a light receiving device also included in the illustrative embodiment.

Referring to FIGS. 1–3, a light receiving module embodying the present invention is shown and includes an optical fiber 4 and a light receiving device 5 having a light-sensitive surface 6. A silicon substrate 1 is formed with a guide groove 2 and a mount groove 3 for receiving the optical fiber 4 and light receiving device 5, respectively. The two grooves 2 and 3 are formed in the silicon substrate 1 by wet etching at the same time. The depth of the mount groove 3 is controlled in terms of etching time such that the center of the light-sensitive surface 6 of the device 5 aligns with the optical axis of the fiber 4.

The mount groove 3 has a rectangular section and includes a mount surface 7. The output end of the guide groove 2 and the mount surface 7 of the mount groove 3 are contiguous with each other. The bottom edge of the mount surface 7 has a width slightly greater than the width of the contact portion the light receiving device 5.

The light receiving device 5 is of rear incidence type and implemented by an InP substrate. The device 5 is sensitive to light over a diameter of 30 mm thereof. FIG. 3 shows opposite sides of the device 5. As shown, a p electrode 10 is formed on the front of the device 5 over the light-sensitive surface 6 in order to reduce parasitic capacity. An n electrode 9 and AuSn solder 13 for electrical connection are formed on the rear of the device 3. A light input window 8 is formed in the n electrode 9.

The tip of the fiber 4 is machined by the same angle as the mount surface 7 of the mount groove 3 so as to be complementary in configuration to the rear of the light receiving device 5.

Figure 4:
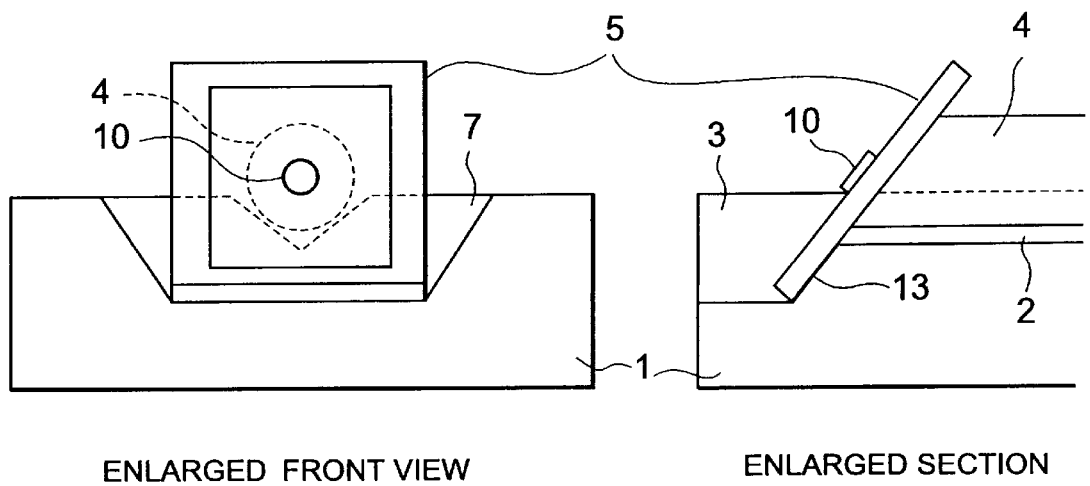
FIG. 4 show in an enlarged front view and an enlarged vertical section a portion of the illustrative embodiment where the light receiving device is mounted.

FIG. 4 demonstrates how the above light receiving module is assembled. As shown, the light receiving device 5 is mounted to the silicon substrate 1 along the mount surface 7 until the bottom of the device 5 contacts the bottom of the mount groove 3. Then, the device 5 is affixed to the mount surface 7. The resulting relation between the device 5 and the substrate 1 is shown in FIG. 4. In this condition, the n electrode 9 of the device 5 is brought into contact with, via the AuSu solder 13, electrodes 11 formed on the substrate 1. Subsequently, the fiber 4 is inserted into the guide groove 2 such that the tip of the fiber 4 is positioned complementarily to the rear of the device 5. Then, the fiber 4 is fixed in place in the guide groove 2.

Figure 5:
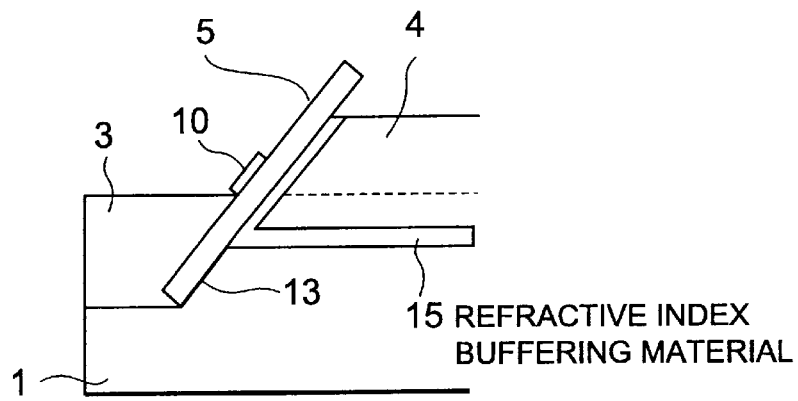
FIG. 5 is an enlarged view showing a modification of the illustrative embodiment.

The above assembly implements an extremely short optical distance between the tip of the fiber 4 and the light-sensitive surface 6 because the fiber 4 and light receiving device 5 are fixed in place in contact with each other. This successfully reduces the spread of light output from the fiber 4 on the light-sensitive surface 6. As shown in FIG. 5, a refractive index buffering material 15 may be provided between the fiber 4 and the device 5 in order to further reduce the radiation angle of light output from the fiber 4. The material 15 may be implemented by, e.g., silicon gel or optical adhesive.

The positional relation between the light receiving device 5 and the fiber 4 shown in FIG. 1 is implemented by the accurate mounting of the device 5 to the substrate 1. In the illustrative embodiment, the device 5 and the bottom of the mount surface 6 are so dimensioned as to be coincident in configuration with each other. Therefore, the mounting accuracy of the device 5 is determined by the forming accuracy of the mount groove 3 and the cutting accuracy of the device 5. This embodiment reduces the positional deviation to about 35 1 mm.

Figure 6:
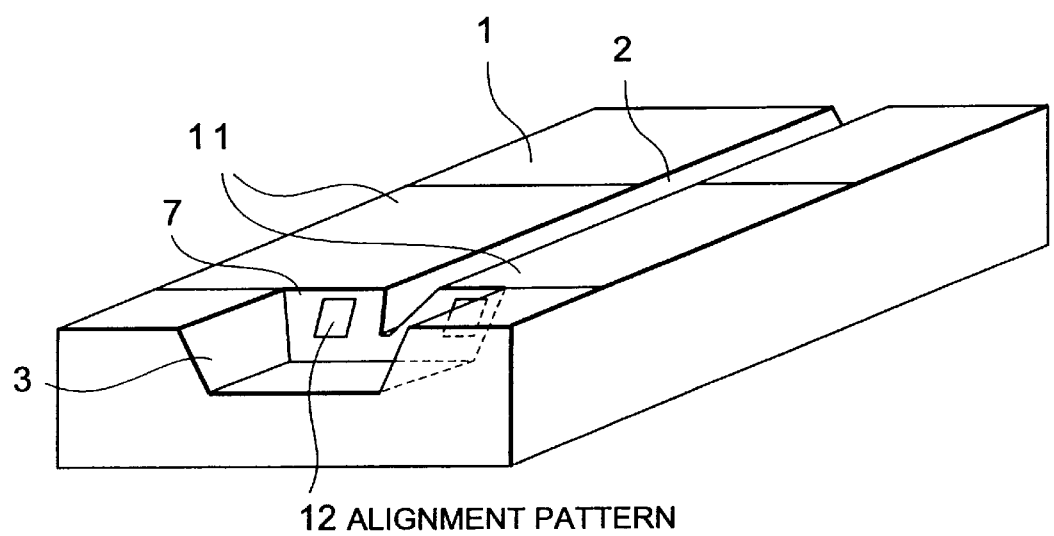
FIG. 6 is a perspective view showing a silicon substrate included in an alternative embodiment of the present invention.
Figure 7:
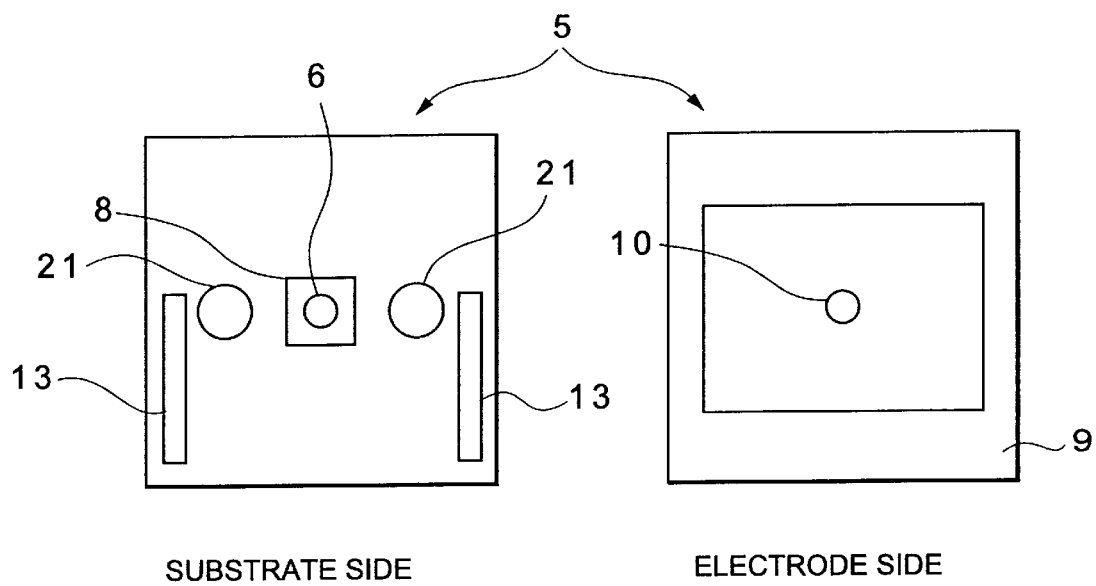
FIG. 7 shows opposite sides of a light receiving device also included in the alternative embodiment.

Reference will be made to FIGS. 6 and 7 for describing an alternative embodiment of the present invention. In this embodiment, the light receiving device 5 is mounted to the silicon substrate 1 by a visual alignment mounting system. As shown in FIG. 6, an alignment pattern 12 for visual alignment is formed on the mount surface 7 symmetrically with respect to the guide groove 2 as a part of a metallized pattern. The AuSn solder 13 is also formed on the mount surface 7 for affixing the device 5. The alignment pattern 12 is positioned such that a desired positional relation holds between it and the optical axis of the optical fiber 4.

As shown in FIG. 7, an alignment pattern 21 is formed on the rear of the device 5 symmetrically with respect to the light-sensitive surface 6 as a part of a metallized pattern. The light input window 8 is also formed in the rear of the device 5. Two symmetrical portions of the alignment pattern 21 are spaced by the same distance from each other as two symmetrical portions of the alignment pattern 12 provided on the mount surface 7.

Figure 8:
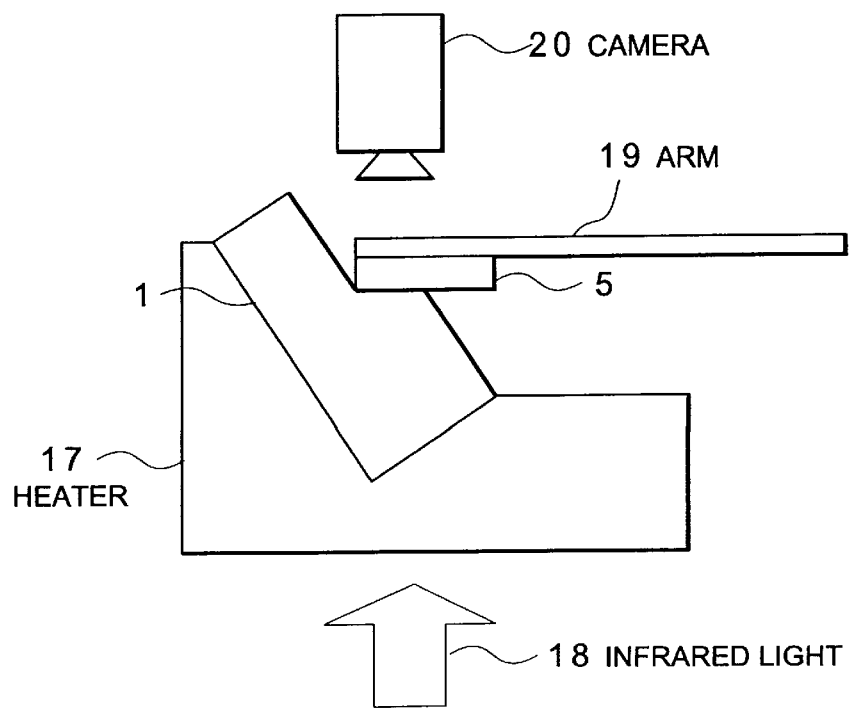
FIG. 8 shows how the silicon substrate of FIG. 6 and the light receiving device of FIG. 7 are affixed to each other.
Figure 9:
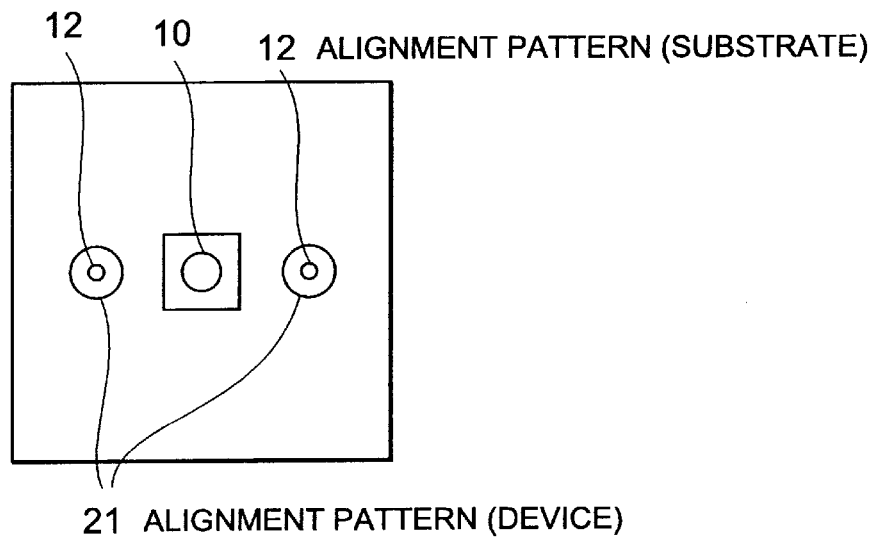
FIG. 9 shows a specific alignment pattern used to affix the substrate and light receiving device in the manner shown in FIG. 8.

FIG. 8 shows how the light receiving device 5 of the alternative embodiment is affixed to the mount surface 7. As shown, the substrate 1 is mounted to a heater 17. While infrared light 18 is projected from the bottom toward the top of the heater 17, the device 5 held by an arm 19 is laid on the substrate 1. At this instant, a camera 20 monitors the alignment pattern 12 of the mount surface 7 and the alignment pattern 21 of the device 21. Image recognition and position processing are executed on the basis of an image being picked up by the camera 20. FIG. 9 shows a monitor image in which the substrate 1 and device 5 are superposed. The arm 19 holding the device 5 is adjusted such that the two portions of the alignment pattern 12 are respectively positioned at the centers of the two portions of the alignment pattern 21, as illustrated. Thereafter, the heater 17 is caused to generate heat for melting the AuSn solder 13 on the substrate 1. As a result, the substrate 1 and device 5 are affixed to each other.

The procedure shown in FIG. 8 allows the substrate 1 and device 5 to be affixed with an accuracy lying in the error range of the visual alignment mounting system, i.e., in the order of submicrons. As a result, a high coupling efficiently is achievable with ease.

An optical coupling characteristic achievable with the fiber 4 and device 5 affixed in the structure of FIG. 1 was estimated. The estimation showed that the optical coupling characteristic was only about 2% lower in quantitative efficiency than in the case where an optical fiber was adjusted to an optimal position. This indicates that highly accurate mounting is achievable without any adjustment.

Figure 10:
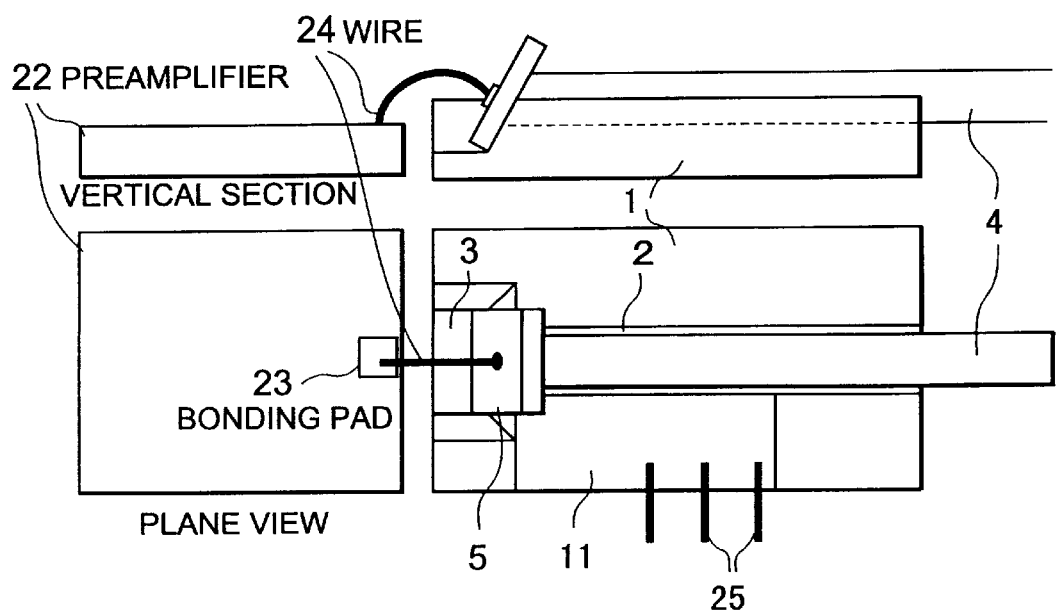
FIG. 10 shows a specific application of the embodiment of FIG. 1 in a plan view and a vertical section.

FIG. 10 shows a specific application of the embodiment shown in FIG. 1 to a preamplifier. As shown, the p electrode 10 of the light receiving device 5 is directly connected to a bonding pad 23 by a wire 24. This configuration is extremely desirable for a preamplifier having high parasitic sensitivity because hardly any parasitic capacity is added to the input portion of the preamplifier 22. The electrodes 11 are used to feed a bias voltage to the substrate 1 and provided with bonding wires 25. The preamplifier 22 and the substrate 1 are arranged in a package (not shown) made of ceramics or metal.

FIG. 11 shows another alternative embodiment of the present invention including a silicon substrate 11. As shown, the mount groove 3 formed in the substrate 11 is slightly greater in dimensions than the contour of the light receiving device 5. The mount groove 3 is formed by, e.g., dry etching the substrate 11 in the vertical direction. For the electrical connection of the device 5, bumps 28 and 29 respectively formed on the n and p electrodes are respectively brought into contact with electrodes 31 and 30 formed on the substrate 11 and then connected together by being melted.

In the structure shown FIG. 11, the positional relationship between the light receiving device 5 and the optical fiber 4 is determined by the accuracy with which the device 5 is received in the mount groove 3. Dimensional accuracy available with etching is generally on the order of several hundreds of angstroms and is determined by the cutting accuracy of the device 5. It follows that the positional deviation between the device 5 and the fiber 4 can be reduced to about ±1 mm.

The coupling characteristic of the device 5 and fiber 4 shown in FIG. 11 was estimated. The estimation showed that the coupling characteristic was only about 2% lower quantitative efficiency than when the fiber 4 was adjusted to an optimal position. This indicates that highly accurate mounting is achievable without any adjustment.

The configuration of FIG. 11 is extremely effective when the electrode of a light receiving device is too small to be directly bonded, although the signal lines formed on the substrate 11 would increase parasitic capacity, compared to the configuration of FIG. 1.

In summary, in accordance with the present invention, a light receiving module allows a light receiving device to be accurately affixed to the mounting surface of a silicon substrate at a desired height aligning with the optical axis of an optical fiber. This, coupled with the fact that the optical coupling length and therefore the coupling loss is small, insures high optical coupling by adjustment-free easy mounting. Further, the light receiving device can be mounted without resorting to a carrier, so that a high frequency characteristic is improved due to a decrease in parasitic capacity.

What is claimed is:

1. A light receiving module comprising:

a semiconductor substrate;

a light receiving device and an optical fiber affixed to said semiconductor device together;

a guide groove formed in said semiconductor substrate and fixedly receiving said optical fiber; and a mount groove formed in said semiconductor substrate contiguously with an output end of said guide groove and fixedly receiving said light receiving device;

wherein a mount surface of said mount groove to which said light receiving device is mounted is contiguous with said output end of said guide groove.

2. A module as claimed in claim 1, wherein said mount groove has a rectangular section to thereby provide said mount surface with a rectangular shape, wherein said light receiving device comprises a flat plate, and wherein said mount surface of said mount groove and a mount surface of said light receiving device are adhered to each other.

3. A module as claimed in claim 2, wherein a bottom edge of said mount surface of said mount groove has a slightly greater width than a bottom edge of said mount surface of said light receiving device.

4. A module as claimed in claim 2, wherein said mount surface of said mount groove and said mount surface of said light receiving device each is formed with a particular alignment pattern.

5. A module as claimed in claim 4, wherein said alignment pattern of said mount groove and said alignment pattern of said light receiving element are recognizable by transmission of infrared light and brought into alignment with each other by infrared light transmission processing.

6. A module as claimed in claim 1, further comprising a refractive index buffering material intervening between said mount surface of said mount groove and said mount surface of said light receiving device.

7. A module as claimed in claim 1, further comprising an output electrode formed on a side of said light receiving device opposite to said mount surface, and a bonding wire directly extending out from said output electrode.

8. A module as claimed in claim 7, wherein said bonding wire is directly connected to an input of an amplifier for amplifying an output of said light receiving device.

* * * * *